United States Patent
Chiba et al.

(10) Patent No.: US 9,574,284 B2
(45) Date of Patent: Feb. 21, 2017

(54) DEPRESSION FILLING METHOD AND PROCESSING APPARATUS

(71) Applicant: TOKYO ELECTRON LIMITED, Tokyo (JP)

(72) Inventors: Youichirou Chiba, Nirasaki (JP); Hiroki Iriuda, Nirasaki (JP); Daisuke Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/018,949

(22) Filed: Feb. 9, 2016

(65) Prior Publication Data

US 2016/0240379 A1    Aug. 18, 2016

(30) Foreign Application Priority Data

Feb. 18, 2015 (JP) .................................. 2015-029734

(51) Int. Cl.
| | |
|---|---|
| *H01L 21/00* | (2006.01) |
| *H01L 31/02* | (2006.01) |
| *C30B 1/02* | (2006.01) |
| *H01L 21/225* | (2006.01) |
| *H01L 21/324* | (2006.01) |

(52) U.S. Cl.
CPC ........... *C30B 1/023* (2013.01); *H01L 21/2252* (2013.01); *H01L 21/3247* (2013.01)

(58) Field of Classification Search
CPC ............ H01L 2224/03848; H01L 2224/27848; H01L 2224/35848
USPC ............ 438/607, 496, 3, 663, 653, 166, 20, 26,438/424, 678, 680, 53, 401, 171
See application file for complete search history.

(56) References Cited

U.S. PATENT DOCUMENTS

2005/0224856 A1* 10/2005 Kito ...................... H01L 29/945
                                                                              257/301

FOREIGN PATENT DOCUMENTS

JP          2014-229857 A      12/2014

* cited by examiner

*Primary Examiner* — Julio J Maldonado
*Assistant Examiner* — Moin Rahman
(74) *Attorney, Agent, or Firm* — Nath, Goldberg & Meyer; Jerald L. Meyer

(57) ABSTRACT

A method of filling a depression of a workpiece is provided. The method includes forming a first thin film made of a semiconductor material substantially not containing an impurity along a wall surface which defines the depression, forming an epitaxial region conforming to crystals of the semiconductor substrate from the semiconductor material of the first thin film moved toward a bottom of the depression by annealing, etching the first thin film remaining on the wall surface, performing gas phase doping upon the epitaxial region, forming a second thin film made of a semiconductor material substantially not containing an impurity along the wall surface, further forming an epitaxial region from the semiconductor material of the second thin film moved toward the bottom of the depression by annealing, and performing gas phase doping upon the second thin film remaining on the wall surface and the epitaxial region.

3 Claims, 6 Drawing Sheets

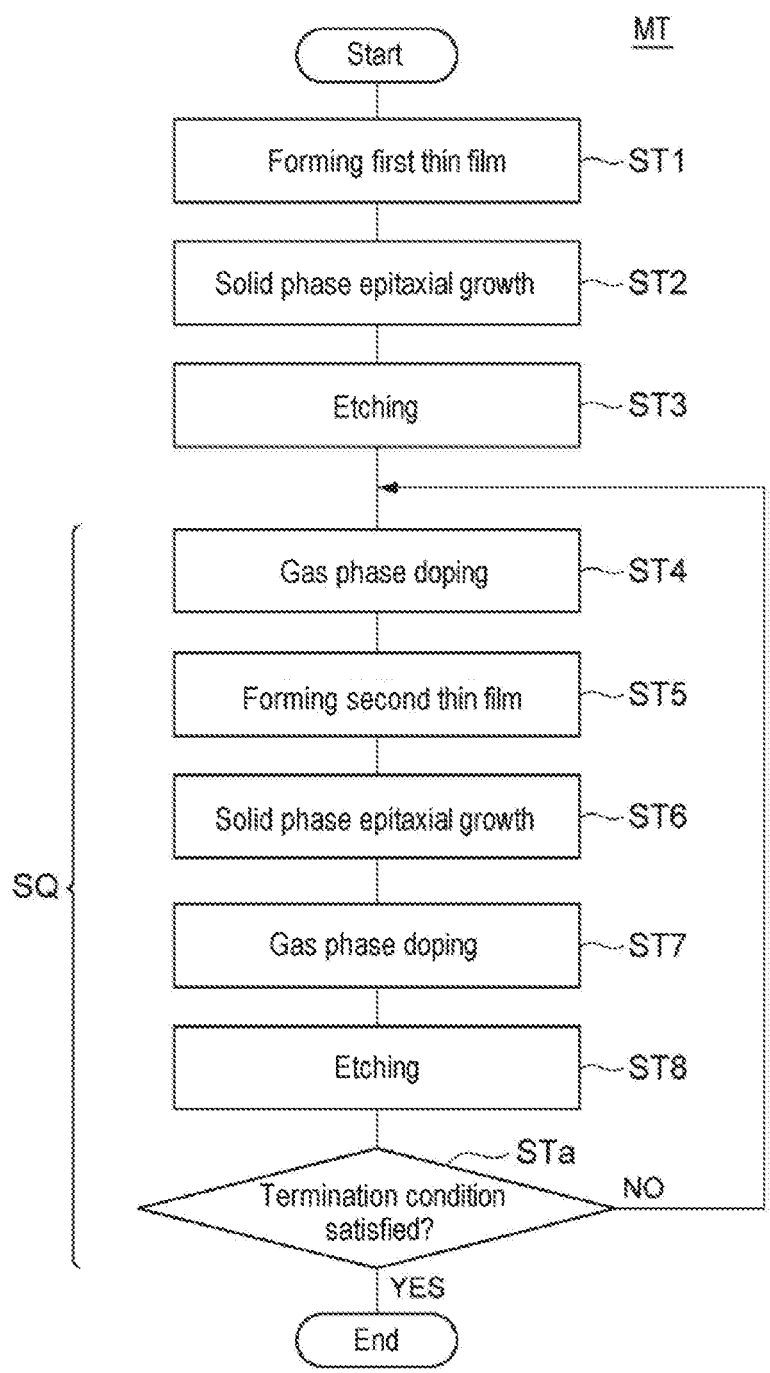

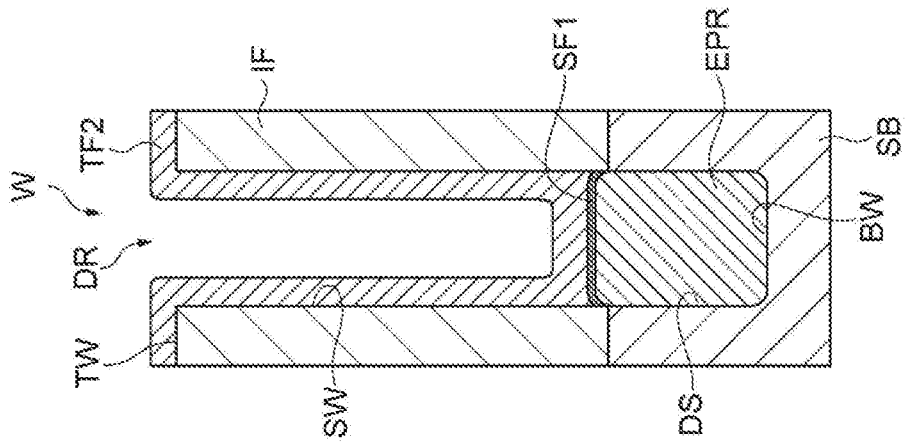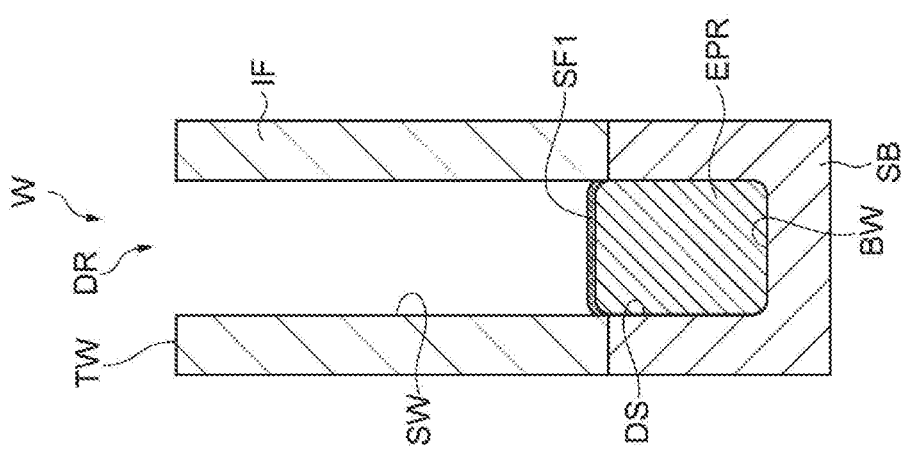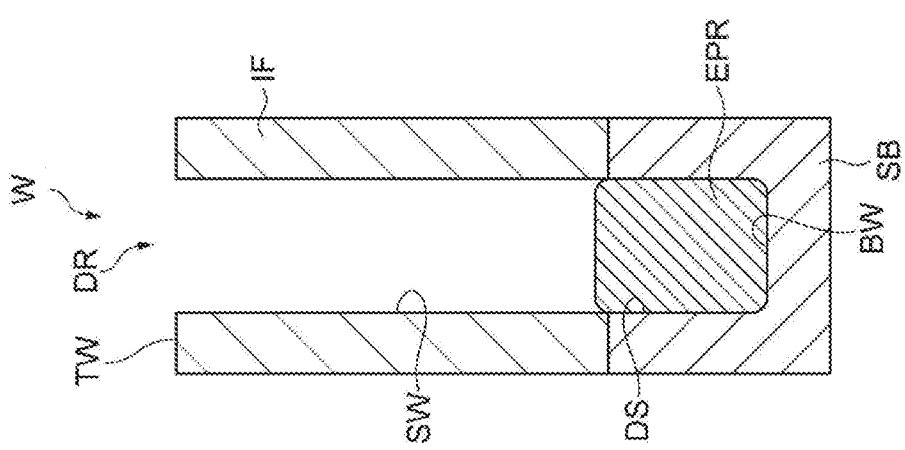

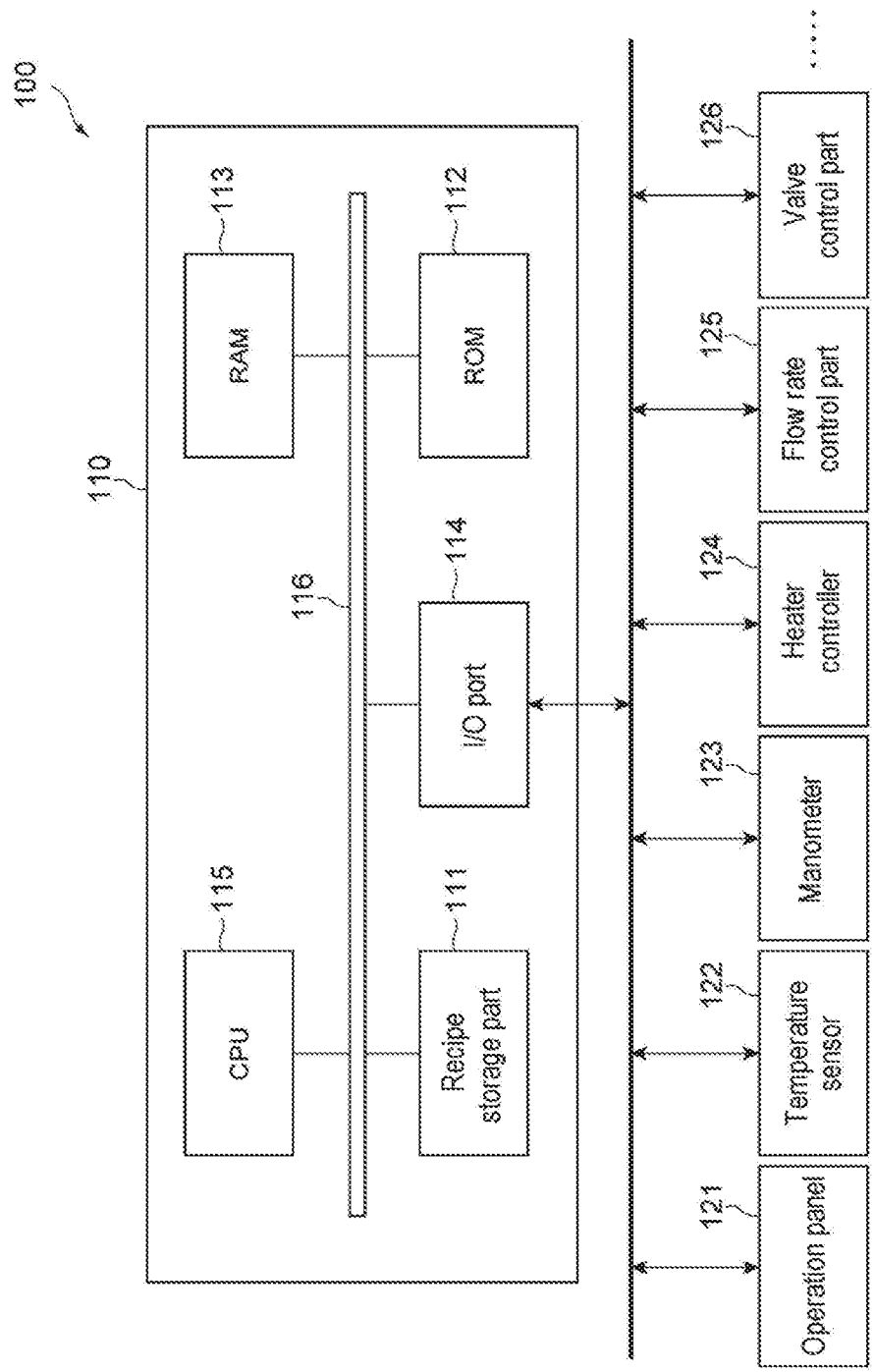

DEPRESSION FILLING METHOD AND PROCESSING APPARATUS

CROSS-REFERENCE TO RELATED APPLICATION

This application claims the benefit of Japanese Patent Application No. 2015-029734, filed on Feb. 18, 2015, in the Japan Patent Office, the disclosure of which is incorporated herein in its entirety by reference.

TECHNICAL FIELD

The present disclosure relates to a depression filling method and a processing apparatus.

BACKGROUND

In the manufacture of a semiconductor device, a process of filling a semiconductor material such as silicon or the like into a depression such as a hole or a trench formed on a surface of a semiconductor wafer may be performed. The semiconductor wafer includes a semiconductor substrate and an insulating film formed on the semiconductor substrate. The depression is formed in the surface of the insulating film (the surface of the semiconductor wafer). The semiconductor material filled into the depression is the same as the material of the semiconductor substrate and is often used as, e.g., an electrode.

In the related art, there is known a method and apparatus for filling a depression formed in an insulating film of a workpiece which is a semiconductor wafer. The depression filling method includes a step of forming a first amorphous silicon film containing an impurity along a wall surface which defines a depression, a step of forming a second amorphous silicon film on the first amorphous silicon film, and a step of annealing the workpiece after the second amorphous silicon film is formed.

A depression provided on a surface of a semiconductor wafer may be formed so as to pass through the insulating film and extend up to an inside portion of a semiconductor substrate which serves as abase of the insulating film. This depression is formed by etching the insulating film and the semiconductor substrate. The present inventors have been studying a technique in which a depression is filled by moving a semiconductor material toward the bottom portion of the depression and forming an epitaxial region conforming to crystals of a semiconductor substrate from the semiconductor material.

A semiconductor material is deposited on a sidewall and a bottom wall of a depression so as not to occlude the depression and then solid phase epitaxial growth is performed with respect to the semiconductor material, so that an epitaxial region is formed in the depression. By repeatedly performing the step of forming the epitaxial region, the epitaxial region is expanded in the depression. In the case where an impurity is not contained in the semiconductor material, addition of an impurity to the epitaxial region can be performed by gas phase doping. If epitaxial growth from the semiconductor material is further performed at a subsequent step on the surface of the epitaxial region to which the impurity is added by the gas phase doping, the impurity already added by the gas phase doping at the step which precedes this step is contained in the epitaxial region formed until this step. The epitaxial region containing an impurity is higher in etching rate than the epitaxial region not containing an impurity. Thus, when the semiconductor material left on the sidewall without undergoing epitaxial growth is removed by etching after the formation of the epitaxial region, there is a possibility that damage attributable to the etching is generated even in the epitaxial region. Accordingly, in the technique of filling a depression by epitaxial growth of a semiconductor material, it is necessary to reduce the influence of etching on an epitaxial region filled into a depression.

SUMMARY

According to one embodiment of the present disclosure, a method of filling a depression of a workpiece is provided. The workpiece includes a semiconductor substrate and an insulating film formed on the semiconductor substrate. The depression passes through the insulating film and extends up to an inside of the semiconductor substrate. The method includes forming a first thin film made of a semiconductor material substantially not containing an impurity along a wall surface which defines the depression, by annealing the workpiece within a vessel, forming an epitaxial region conforming to crystals of the semiconductor substrate from the semiconductor material of the first thin film moved toward a bottom of the depression, etching the first thin film remaining on the wall surface which defines the depression, performing gas phase doping upon the epitaxial region, forming a second thin film made of a semiconductor material substantially not containing an impurity along the wall surface which defines the depression, by annealing the workpiece within the vessel, further forming an epitaxial region from the semiconductor material of the second thin film moved toward the bottom of the depression; and performing gas phase doping upon the second thin film remaining on the wall surface which defines the depression and the epitaxial region.

According to another embodiment of the present disclosure, there is provided a processing apparatus including a vessel, a gas supply part configured to supply a first gas which forms a first thin film made of a semiconductor material substantially not containing an impurity, a second gas which forms a second thin film made of a semiconductor material substantially not containing an impurity, a third gas which etches the first thin film and a fourth gas for use in gas phase doping, into the vessel, a heating device configured to heat an internal space of the vessel; and a control part configured to control the gas supply part and the heating device, wherein the control part is configured to execute a first control which causes the gas supply part to supply the first gas into the vessel, a second control which causes the heating device to heat the internal space of the vessel after the first control is executed, a third control which causes the gas supply part to supply the third gas into the vessel after the second control is executed, a fourth control which causes the gas supply part to supply the fourth gas into the vessel after the third control is executed, a fifth control which causes the gas supply part to supply the second gas into the vessel after the fourth control is executed, a sixth control which causes the heating device to heat the internal space of the vessel after the fifth control is executed, and a seventh control which causes the gas supply part to supply the fourth gas into the vessel after the sixth control is executed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating a depression filling method according to an embodiment.

FIGS. 3A to 3C are sectional views illustrating the states of a workpiece which has been subjected to respective steps of the method illustrated in FIG.

FIG. 6 is an illustrative block diagram showing a configuration of a control part of the processing apparatus shown in FIG. 5.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2A:
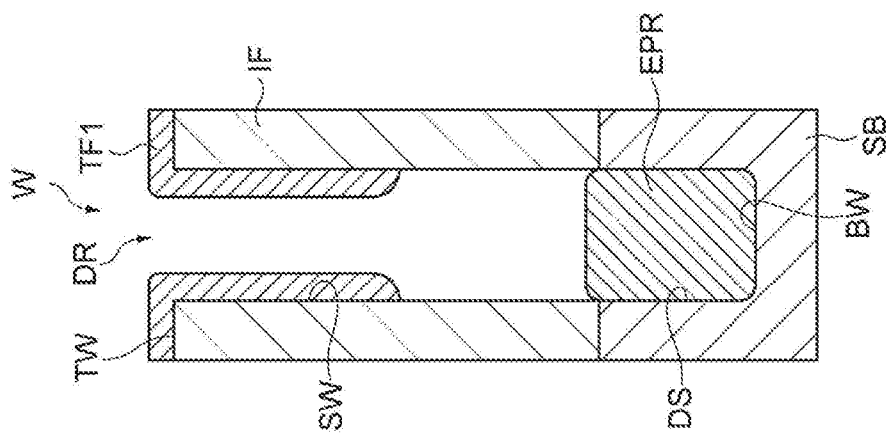
FIGS. 2A to 2C are sectional views illustrating the initial state of a workpiece which is not subjected to the method illustrated in FIG. 1 and the states of a workpiece which has been subjected to respective steps of the method illustrated in FIG. 1.
Figure 2B:
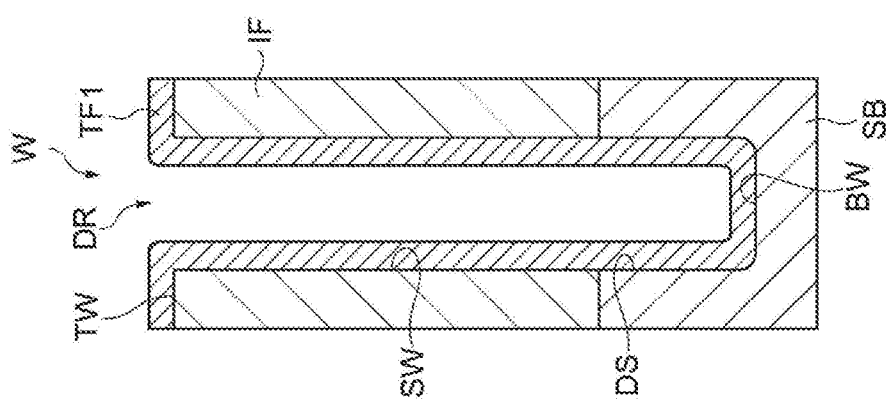
Figure 2C:
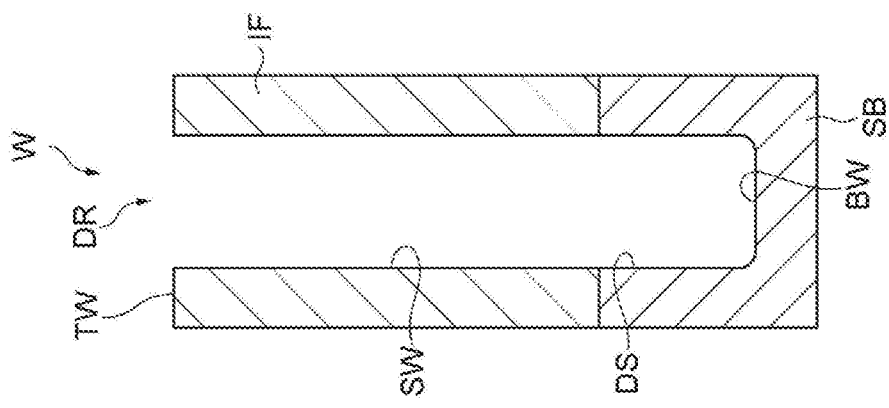

FIG. 1 is a flowchart illustrating a depression filling method according to an embodiment. FIGS. 2A to 2C are sectional views illustrating an initial state of a workpiece which is not subjected to the method illustrated in FIG. 1 and states of the workpiece which has been subjected to respective steps of the method illustrated in FIG. 1. FIGS. 3A to 3C and FIGS. 4A to 4C are sectional views illustrating states of the workpiece which has been subjected to respective steps of the method illustrated in FIG. 1. The method MT illustrated in FIG. 1 is a method of causing a semiconductor material to epitaxially grow in a depression of the workpiece, thereby filling the depression.

In an initial state before the application of the method MT, a workpiece (hereinafter often referred to as a "wafer W") has a configuration illustrated in FIG. 2A. The wafer W includes a semiconductor substrate SB and an insulating film IF. The semiconductor substrate SB may be a monocrystalline semiconductor substrate or a polycrystalline semiconductor substrate, e.g., a monocrystalline silicon substrate or a polycrystalline silicon substrate. The insulating film IF is formed on the semiconductor substrate SB. The insulating film IF has a top surface TW. The insulating film IF may be formed of, e.g., silicon oxide ($SiO_2$) or silicon nitride ($Si_3N_4$).

A depression DR such as a trench or a hole a contact hole, etc.) is formed in the wafer W. The depression DR is formed to pass through the insulating film IF from the top surface TW in a film thickness direction and also extend up to an inside portion of the semiconductor substrate SB. The depression DR may have a depth of, e.g., about 190 nm to 210 nm, and a width of, e.g., about 40 nm to 50 nm. The depression DR is defined by a side wall surface SW and a bottom surface BW. The side wall surface SW defines the depression DR at the lateral side. The bottom surface BW defines the depression DR at the lower side. The side wall surface SW includes a surface DS. The surface DS defines the depression DR of the semiconductor substrate SB at the lateral side. The depression DR may be formed by forming a mask on the insulating film IF and etching the insulating film IF and the semiconductor substrate SB.

In the method MT, steps ST1, ST2, ST3, ST4, ST5, ST6 and ST7 are carried out with respect to the wafer W illustrated in FIG. 2A. In some embodiments, a sequence SQ including steps ST4 to ST7 may be repeated. In some embodiments, step ST8 may be further carried out. Step ST8 is included in the sequence SQ.

Figure 5:
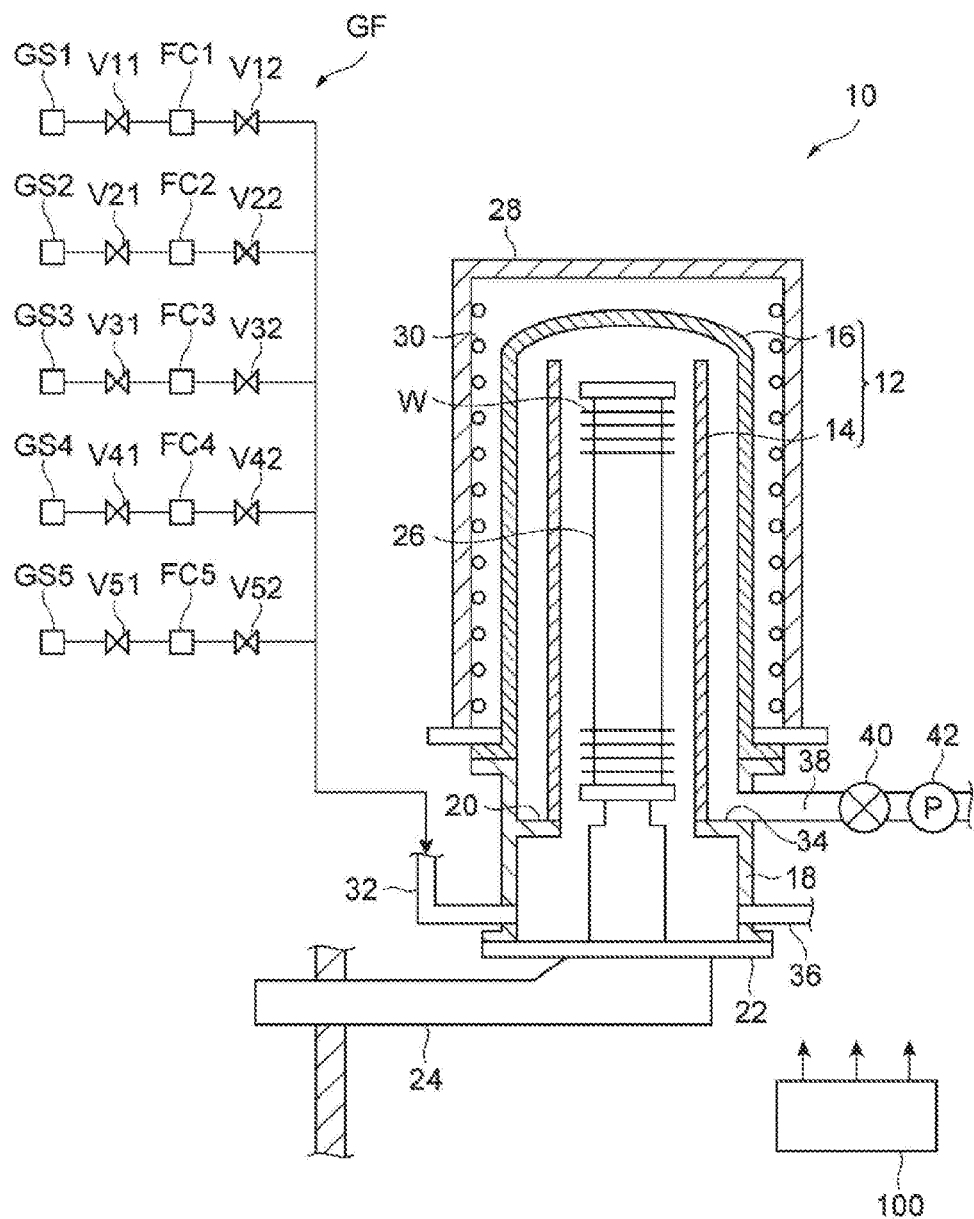
FIG. 5 is a view schematically showing a processing apparatus that can be used in implementing the method illustrated in FIG. 1.

An embodiment of a processing apparatus that can be used in implementing the method MT will be described. FIG. 5 is a view schematically showing the processing apparatus that can be used in implementing the method illustrated in FIG. 1. The processing apparatus 10 shown in FIG. 5 includes a vessel 12, an inner tube 14, an outer tube 16, a manifold 18, a support ring 20, a lid 22, a boat elevator 24, a wafer boat 26, a heat insulating body 28, heaters 30, a gas introduction pipe 32, an exhaust port 34, a purge gas supply pipe 36, an exhaust pipe 38, a valve 40, an exhaust device 42, a control part 100 and a gas supply part GF.

The vessel 12 has a double tube structure. The longitudinal direction of the vessel 12 is oriented in a vertical direction. The vessel 12 is a reaction tube having a substantially cylindrical shape. The vessel 12 includes an inner tube 14 and an outer tube 16. The inner tube 14 and the outer tube 16 are made of a material having an excellent property in heat resistance and corrosion resistance, e.g., quartz.

The inner tube 14 has a substantially cylindrical shape. The inner tube 14 includes an upper end and a lower end. The upper and lower ends of the inner tube 14 are opened. The outer tube 16 is installed in a substantially coaxial relationship with the inner tube 14 so as to cover the inner tube 14. The inner tube 14 and the outer tube 16 are formed to be spaced apart from each other at a constant distance. An upper end of the outer tube 16 is closed and a lower end of the outer tube 16 is opened. The manifold 18 is installed below the outer tube 16.

The manifold 18 is formed in a tubular shape and may be made of, e.g., stainless steel (SUS). The manifold 18 is air-tightly connected to the lower end of the outer tube 16. The support ring 20 is integrally formed on the inner wall of the manifold 18 in one piece. The support ring 20 protrudes inward from the inner wall of the manifold 18. The support ring 20 supports the inner tube 14. The lid 22 is installed below the manifold 18.

The lid 22 is connected to the boat elevator 24 and can be moved up and down by the boat elevator 24. When the lid 22 is moved up by the boat elevator 24, a lower side (namely, a throat portion) of the manifold 18 is closed. When the lid 22 is moved down by the boat elevator 24, the lower side (namely, the throat portion) of the manifold 18 is opened. The wafer boat 26 is placed on the lid 22.

The wafer boat 26 may be made of, e.g., quartz. The wafer boat 26 is configured to support a plurality of wafers W with a pre-specified gap left between the respective wafers in the vertical direction.

The heat insulating body 28 is installed around the vessel 12 so as to surround the vessel 12. The heaters (or a heating device) 30 are installed on the inner wall surface of the heat insulating body 28. The heaters 30 are composed of, e.g., resistance heating elements and are configured to heat the internal space of the vessel 12. The internal space of the vessel 12 is heated to a specified temperature by the heaters 30. Thus, the wafers W accommodated in the internal space of the vessel 12 are heated.

At least one gas introduction pipe 32 is connected to the side surface of the manifold 18. For example, the gas introduction pipe 32 is connected to the side surface of the manifold 18 at a position lower than the support ring 20. A gas line configured by the gas introduction pipe 32 communicates with the interior of the vessel 12.

The gas supply part GF is connected to the gas introduction pipe 32. In some embodiments, the gas supply part GF includes gas sources GS1, GS2, GS3, GS4 and GS5, valves V11, V12, V21, V22, V31, V32, V41, V42, V51 and V52, and flow rate controllers FC1, FC2, FC3, FC4 and FC5 such as mass flow controllers or the like. The gas source GS1 is connected to the gas introduction pipe 32 through the valve V11, the flow rate controller FC1 and the valve V12. The gas source GS2 is connected to the gas introduction pipe 32 through the valve V21, the flow rate controller FC2 and the valve V22. The gas source GS3 is connected to the gas introduction pipe 32 through the valve V31, the flow rate controller FC3 and the valve V32. The gas source GS4 is connected to the gas introduction pipe 32 through the valve V41, the flow rate controller FC4 and the valve V42. The gas source GS5 is connected to the gas introduction pipe 32 through the valve V51, the flow rate controller FC5 and the valve V52.

The gas supply part GF is configured to supply, particularly, a first gas for forming a first thin film TF1 made of a semiconductor material substantially not containing an impurity, a second gas for forming a second thin film TF2 made of a semiconductor material substantially not containing an impurity, a third gas for etching the first thin film TF1, a fourth gas for use in gas phase doping (GPD) and a fifth gas for etching the second thin film TF2, into the vessel 12. The first gas is used at step ST1 which will be described later. The second gas is used at step ST5 which will be described later. The third gas is used at step ST3 which will be described later. The fourth gas is used in the gas phase doping at steps ST4 and ST7 which will be described later. The fifth gas is used at step ST8 which will be described later.

The gas source GS1 is a source of a raw material gas included in the first gas and the second gas. The gas source GS1 may be a source of a silicon-containing gas, a germanium-containing gas or a mixed gas of a silicon-containing gas and a germanium-containing gas. Specifically, the gas source GS1 is a source of a silicon-containing gas when a thin film formed at step ST and step ST5 is composed of silicon. The silicon-containing gas may be a monosilane gas, a disilane gas or an aminosilane-based gas. The gas source GS1 is a source of a germanium-containing gas such as a mono-germanium gas or the like in the case where a thin film formed at step ST and step ST5 is composed of germanium. The gas source GS1 may be a source of a mixed gas of a silicon-containing gas and a germanium-containing gas in the case where a thin film formed at step ST and step ST5 is composed of silicon and germanium.

The gas source GS2 is a source of an impurity source gas which is the fourth gas. Examples of the impurity may include arsenic (As), boron (B) and phosphorus (P). Examples of the impurity source gas may include phosphine ($PH_3$), diborane ($B_2H_6$), boron trichloride ($BCl_3$) and arsine ($AsH_3$).

The gas source GS3 is a source of an additive gas. Examples of the additive gas may include a $C_2H_4$ gas, a $N_2O$ gas, a NO gas and a $NH_3$ gas. In some embodiments, one or more of the $C_2H_4$ gas, the $N_2O$ gas, the NO gas and the $NH_3$ gas may be used as the additive gas.

The gas source GS4 is a source of an inert gas that can be used in annealing. Examples of the inert gas may include a hydrogen gas ($H_2$ gas) and a nitrogen gas ($N_2$ gas).

The gas source GS5 is a source of an etching gas which is included in the third gas used at step ST3 and the fifth gas used at step ST8. As the etching gas, it is possible to use a gas containing one or more of $Cl_2$, HCl, $F_2$, $Br_2$ and HBr. An arbitrary gas may be used as the etching gas as long as it can selectively etch the first thin film TF1 and the second thin film TF2 with respect to the insulating film IF and the epitaxial region EPR.

As shown in FIG. 5, an exhaust port 34 through which a gas existing at the inner side of the vessel 12 is exhausted, is formed in the side surface of the manifold 18. The exhaust port 34 is arranged above the support ring 20 and is in communication with the space formed between the inner tube 14 and the outer tube 16 of the vessel 12. Accordingly, an exhaust gas generated within the inner tube 14 flows toward the exhaust port 34 through the space formed between the inner tube 14 and the outer tube 16.

The purge gas supply pipe 36 is connected to the manifold 18. The purge gas supply pipe 36 is connected to the manifold 18 below the exhaust port 34. The purge gas supply pipe 36 is connected to a purge gas supply source (not shown). A purge gas, e.g., a nitrogen gas, is supplied from the purge gas supply source into the vessel 12 through the purge gas supply pipe 36.

An exhaust pipe 38 is air-tightly connected to the exhaust port 34. The valve 40 and the exhaust device 42 such as a vacuum pump or the like are sequentially installed in the exhaust pipe 38 from the upstream side of the exhaust pipe 38. The valve 40 is configured to adjust an opening degree of the exhaust pipe 38, thereby controlling an internal pressure of the vessel 12 at a predetermined pressure. The exhaust device 42 is a device which depressurizes the internal space of the vessel 12. The exhaust device 42 discharges a gas from the vessel 12 through the exhaust pipe 38 and adjusts the internal pressure of the vessel 12. In some embodiments, a trap, a scrubber, and so forth may be installed in the exhaust pipe 38, and the processing apparatus 10 may be configured to detoxify the exhaust gas discharged from the vessel 12 before the exhaust gas is exhausted out of the processing apparatus 10.

The processing apparatus 10 further includes the control part 100 configured to control individual parts of the processing apparatus 10. FIG. 6 shows the configuration of the control part 100. As shown in FIG. 6, the control part 100 includes a main control part 110, an operation panel 121, a temperature sensor (group) 122, a manometer (group) 123, a heater controller 124, a flow rate control part 125 and a valve control part 126. Particularly, the control part 100 controls the gas supply part GF, the heaters 30 and the exhaust device 42.

The operation panel 121, the temperature sensor (group) 122, the manometer (group) 123, the heater controller 124, the flow rate control part 125, the valve control part 126 and so forth are connected to the main control part 110.

The operation panel 121 includes a display screen and operation buttons and is configured to transmit an operator's operation instruction to the main control part 110. The operation panel 121 is configured to allow the display screen to display various types of information transmitted from the main control part 110.

The temperature sensor (group) 122 is configured to measure internal temperatures of the vessel 12, the gas introduction pipe 32, the exhaust pipe 38 and the like, and reports the measured temperature values to the main control part 110. The manometer (group) 123 is configured to measure internal pressures of the vessel 12, the gas introduction pipe 32, the exhaust pipe 38 and the like, and reports the measured pressure values to the main control part 110.

The heater controller 124 is configured to individually control the heaters 30. In response to the instruction transmitted from the main control part 110, the heater controller 124 is configured to supply electric power to the heaters 30, thereby causing the heaters 30 to generate heat. The heater controller 124 is configured to individually measure power consumption of the heaters 30 and reports the measured power consumption to the main control part 110.

The flow rate control part 125 is configured to control the flow rate controllers FC1 to FC5 of the gas supply part GF such that the flow rates of the gases flowing through the gas introduction pipe 32 are set to become equal to the flow rates instructed by the main control part 110. Moreover, the flow rate control part 125 is configured to measure flow rates of the gases actually flowing through the gas introduction pipe 32 and reports the measured flow rate values to the main control part 110. The valve control part 126 is configured to control opening degrees of the valves according to the values instructed by the main control part 110.

The main control part 110 includes a recipe storage part 111, a ROM 112, a RAM 113, an I/O port 114, a CPU 115, and a bus 116 which interconnects the recipe storage part 111, the ROM 112, the RAM 113, the I/O port 114 and the CPU 115.

A setup recipe and a plurality of process recipes are stored in the recipe storage part 111. The recipe storage part 111 is configured to only store the setup recipe when the processing apparatus 10 is initially manufactured. The setup recipe is executed to generate a thermal model or the like corresponding to different processing apparatuses. The process recipes are prepared for each individual process which is actually performed pursuant to the user's desire. For example, the process recipes define various conditions such as a variation in temperature in the respective areas, a variation in the internal pressure of the vessel 12, the start and stop timing for supplying the gas, the supply amount of the gas, and the like, from the time at which the wafers W are loaded into the vessel 12 to the time at which the processed wafers W are unloaded from the vessel 12.

The ROM 112 is formed of an EEPROM, a flash memory, a hard disk or the like. The ROM 112 is a storage medium for storing an operation program of the CPU 115. The RAM 113 serves as a work area or the like of the CPU 115.

The I/O port 114 is connected to the operation panel 121, the temperature sensor (group) 122, the manometer (group) 123, the heater controller 124, the flow rate control part 125, the valve control part 126 and the like. The I/O port 114 is configured to control the input and output of data or signals.

The CPU 115 is the core of the main control part 110 and executes the control program stored in the ROM 112. In response to the instructions transmitted from the operation panel 121, the CPU 115 generally controls the operation of the processing apparatus 10 depending on the recipes (process recipes) stored in the recipe storage part 111. The CPU 115 controls the temperature sensor (group) 122, the manometer (group) 123, the flow rate control part 125, and the like to respectively measure the temperatures, the pressures and the flow rates, and the like within the vessel 12, the gas introduction pipe 32 and the exhaust pipe 38. Based on the measured data, the CPU 115 outputs control signals and the like to the heater controller 124, the flow rate control part 125, the valve control part 126 and the like and controls the respective parts pursuant to the process recipes. The bus 116 is configured to transmit information between the respective parts.

Hereinafter, the method MT, which can be implemented by the processing apparatus 10 configured as above, will be described with reference to FIGS. 1 to 4.

In the method MT according to one embodiment, step ST1 illustrated in FIG. 1 is first implemented. At step ST1, as illustrated in FIG. 2B, the first thin film TF1 substantially not containing an impurity is formed. The expression "substantially not containing an impurity" means that an impurity is not contained at all, or even if the impurity is contained, its effect is equivalent to that of a case not containing an impurity at all.

The first thin film TF1 may be an amorphous semiconductor film, for example, an amorphous silicon film, an amorphous germanium film or an amorphous silicon-germanium film. In this case, the semiconductor substrate SB may be a monocrystalline semiconductor substrate or a polycrystalline semiconductor substrate, for example, a monocrystalline silicon substrate or a polycrystalline silicon substrate. The first thin film TF1 may be a polycrystalline semiconductor film, for example, a polycrystalline silicon film, a polycrystalline germanium film or a polycrystalline silicon germanium film. In this case, the semiconductor substrate SB may be a monocrystalline semiconductor substrate, for example, a monocrystalline silicon substrate.

The first thin film TF1 is formed along the wall surfaces which define the depression DR, so as not to occlude the depression DR. The first thin film TF1 is formed along the side wall surface SW, the bottom surface BW and the top surface TW. The first thin film TF1 may be directly formed on the side wall surface SW, the bottom surface BW and the top surface TW. The thickness of the first thin film TF1 is set to fall within a range of, e.g., about 10 nm to 13 nm. When forming the first thin film TF1 at step ST1, an impurity is not contained in the first thin film TF1.

At step ST1, in order to form the first thin film TF1, the first gas is supplied into the vessel 12 which accommodates the wafers W. The first gas includes a raw material gas, namely a silicon-containing gas, a germanium-containing gas or a mixed gas of a silicon-containing gas and a germanium-containing gas. At step ST1, the internal pressure of the vessel 12 is set at a predetermined pressure and the internal temperature of the vessel 12 is set at a predetermined temperature. At step ST1, the raw material gas is supplied into the vessel 12 at a flow rate which falls within a range of, e.g., about 50 sccm to 5,000 sccm. At step ST1, the internal pressure of the vessel 12 is set at a pressure which falls within a range of, e.g., about $1.0 \times 10^{-1}$ Torr (13 Pa) to 10 Torr ($1.3 \times 10^3$ Pa). The internal temperature of the vessel 12 is set at a temperature which falls within a range of, e.g., about 300 degrees C. to 700 degrees C.

The first gas may further include an additive gas. The additive gas may include, for example, one or more of a $C_2H_4$ gas, a $N_2O$ gas, a NO gas and a $NH_3$ gas. At step ST1, the flow rate of the additive gas is set at a flow rate which falls within a range of, e.g., about 5 sccm to 1,000 sccm. The first gas does not include an impurity source gas supplied by the gas source GS2.

When step ST1 is implemented by using the processing apparatus 10, the control part 100 executes a control (a first control) which will be described below. In the first control, the control part 100 causes the gas supply part GF to supply the first gas into the vessel 12. Specifically, in the first control, the control part 100 controls the valve V1, the flow rate controller FC1 and the valve V12 so that the raw material gas is supplied from the gas source GS1 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature. When an additive gas is used at step ST1, the control part 100 may control the valve V31, the flow rate controller FC3 and the valve V32 so that the additive gas is supplied from the gas source GS3 into the vessel 12 at a predetermined flow rate.

At step ST2 illustrated in FIG. 1, which is subsequent to step ST1, an epitaxial region EPR is formed from the semiconductor material of the first thin film TF1 as illustrated in FIG. 2C. At step ST2, by annealing the wafers W within the vessel 12, an epitaxial region is formed from the semiconductor material of the first thin film TF1, which migrates toward the bottom of the depression DR. Specifically, migration is generated at step ST2, so that the semiconductor material of the first thin film TF1 migrates toward the bottom of the depression DR which results in growing an epitaxial region by solid phase epitaxial growth such that the migrating semiconductor material has a crystal structure conforming to the crystal structure of the semiconductor substrate SB.

At step ST2, the wafers W are annealed within the vessel 12 set at a first pressure. Specifically, at step ST2, the internal temperature of the vessel 12 which accommodates the wafers W is set at a predetermined temperature. For example, the internal temperature of the vessel 12 is set at a temperature which falls within a range of about 300 degrees C. to 600 degrees C. At step ST2, the internal pressure of the vessel 12 is set at a first pressure. The first pressure may be, e.g., a pressure equal to or higher than $1.0 \times 10^{-10}$ Torr ($1.3 \times 10^{-8}$ Pa). The first pressure may be, e.g., a pressure equal to or lower than 1.0 Torr ($1.3 \times 10^2$ Pa). Moreover, at step ST2, an inert gas such as a hydrogen gas or a nitrogen gas may be supplied into the vessel.

When step ST2 is implemented by using the processing apparatus 10, the control part 100 executes a control (second control) which will be described below. In the second control, after the first control is executed, the control part 100 causes the heaters 30 to heat the internal space of the vessel 12. More specifically, in the second control, after the first control is executed, the control part 100 causes the exhaust device 42 to set the internal pressure of the vessel 12 at a first pressure. Furthermore, the control part 100 causes the heaters 30 to heat the internal space of the vessel 12. Specifically, in the second control, the control part 100 controls the exhaust device 42 so that the internal pressure of the vessel 12 is set at a first pressure, and controls the heaters 30 so that the internal temperature of the vessel 12 is set at a predetermined temperature. In the case of using an inert gas, the control part 100 controls the valve V41, the flow rate controller FC4 and the valve V42 so that an inert gas is supplied from the gas source GS4 into the vessel 12 at a predetermined flow rate.

At step ST3 illustrated in FIG. 1, which is subsequent to step ST2, the first thin film TF1 left on the side wall surface SW without constituting the epitaxial region EPR is etched and removed as illustrated in FIG. 3A. At step ST3, the third gas is supplied at a predetermined flow rate into the vessel 12 which accommodates the wafers W. The third gas may contain one or more of $Cl_2$, HCl, $F_2$, $Br_2$ and HBr. The flow rate of the third gas may be, e.g., a flow rate which falls within a range of about 10 sccm to 5.000 sccm. At step ST3, the internal pressure of the vessel 12 is set at a predetermined pressure and the internal temperature of the vessel 12 is set at a predetermined temperature. The internal pressure of the vessel 12 at step ST3 may be, e.g., a pressure which falls within a range of about $1.0 \times 10^{-10}$ Torr ($1.3 \times 10^{-8}$ Pa) to $1.0 \times 10^2$ Torr ($1.3 \times 10^4$ Pa). The internal temperature of the vessel 12 at step ST3 may be, e.g., a temperature which falls within a range of about 200 degrees C. to 700 degrees C. The etching rate of the first thin film TF1 by the third gas is higher than the etching rate of the epitaxial region EPR by the third gas. Accordingly, as a result of step ST3, as illustrated in FIG. 3A, it is possible to selectively remove the first thin film TF1 while leaving the epitaxial region EPR.

When step ST3 is implemented by using the processing apparatus 10, the control part 100 executes a control (a third control) which will be described below. In the third control, the control part 100 causes the gas supply part GF to supply the third gas into the vessel 12 during a time period between the execution of the second control and the execution of the fourth control which will be described later. Specifically, in the third control, the control part 100 controls the valve v51, the flow rate controller FC5 and the valve V52 so that the third gas is supplied from the gas source GS5 into the vessel 12 at a predetermined flow rate during a time period between the execution of the second control and the execution of the fourth control which will be described later. The control part 100 controls the exhaust device 42 so that the internal pressure of the vessel 12 is set at a predetermined pressure. The control part 100 controls the heaters 30 so that the internal temperature of the vessel 12 is set at a predetermined temperature.

The remaining portion of the first thin film TF1 existing on the side wall surface SW may include a polycrystalline region due to the annealing performed at step ST2. Although the remaining portion of the first thin film TF1 includes the polycrystalline region, since an etching rate of the polycrystalline region is higher than that of the epitaxial region EPR, it is possible to selectively remove the remaining portion of the first thin film TF1 including the polycrystalline region by the etching performed at step ST3 while leaving the epitaxial region EPR.

At step ST4 illustrated in FIG. 1, which is subsequent to step ST3, gas phase doping is performed with respect to the epitaxial region EPR. As illustrated in FIG. 3B, an impurity is doped on the surface of the epitaxial region EPR. Thus, a doping layer SF1 having a relatively high impurity concentration is formed on the surface of the epitaxial region EPR.

At step ST4, in order to perform the gas phase doping, the fourth gas is supplied into the vessel 12 which accommodates the wafers W. The fourth gas is an impurity source gas. Examples of the impurity may include arsenic (As), boron (B) and phosphorus (P). As the impurity source gas, it may be possible to use, for example, phosphine ($PH_3$), diborane ($B_2H_6$), boron trichloride ($BCl_3$) and arsine ($AsH_3$). At step ST4, the flow rate of the impurity source gas (the fourth gas) is set at a flow rate which falls within a range of, e.g., about 5 sccm to 5,000 sccm. At step ST4, the internal pressure of the vessel 12 is set at a pressure which falls within a range of, e.g., about $1.0 \times 10^{-1}$ Torr (13 Pa) to 10 Torr ($1.3 \times 10$ Pa). The internal temperature of the vessel 12 is set at a temperature which falls within a range of, e.g., about 300 degrees C. to 700 degrees C.

When step ST4 is implemented by using the processing apparatus 10, the control part 100 executes a control (a fourth control) which will be described below. In the fourth control, after the third control is executed, the control part 100 causes the gas supply part GF to supply the fourth gas into the vessel 12. Specifically, in the fourth control, after the third control is executed, the control part 100 controls the valve V21, the flow rate controller FC2 and the valve V22 so that the impurity source gas is supplied from the gas source GS2 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature.

At step ST5 illustrated in FIG. 1, which is subsequent to step ST4, the second thin film TF2 substantially not containing an impurity is formed as illustrated in FIG. 3C. The second thin film TF2 may be an amorphous semiconductor film, for example, an amorphous silicon film, an amorphous germanium film or an amorphous silicon-germanium film. In this case, the semiconductor substrate SB may be a monocrystalline semiconductor substrate or a polycrystalline semiconductor substrate, for example, a monocrystalline silicon substrate or a polycrystalline silicon substrate. The second thin film TF2 may be a polycrystalline semiconductor film, for example, a polycrystalline silicon film, a polycrystalline germanium film or a polycrystalline silicon germanium film. In this case, the semiconductor substrate SB may be a monocrystalline semiconductor substrate, for example, a monocrystalline silicon substrate. The second thin film TF2 is formed along the surfaces which define the depression DR, so as not to occlude the depression DR. The second thin film TF2 is formed on the doping layer SF1 formed on the surface of the epitaxial region EPR at step ST4. The second thin film TF2 makes contact with the doping layer SF1. The thickness of the second thin film TF2 is set at a thickness of, e.g., about 10 nm to 13 nm. The processing for the formation of the second thin film TF2 performed at step ST5 is similar to the processing for the formation of the first thin film TF1 performed at step ST1. The second gas similar to the first gas is used. When forming the second thin film TF2 at step ST5, an impurity is not contained in the second thin film TF2, same as the formation of the first thin film TF1 at step ST1.

When step ST5 is implemented by using the processing apparatus 10, a fifth control similar to the first control described above is executed by the control part 100. In the fifth control, after the fourth control is executed, the control part 100 causes the gas supply part GF to supply the second gas into the vessel 12.

Figure 4A:
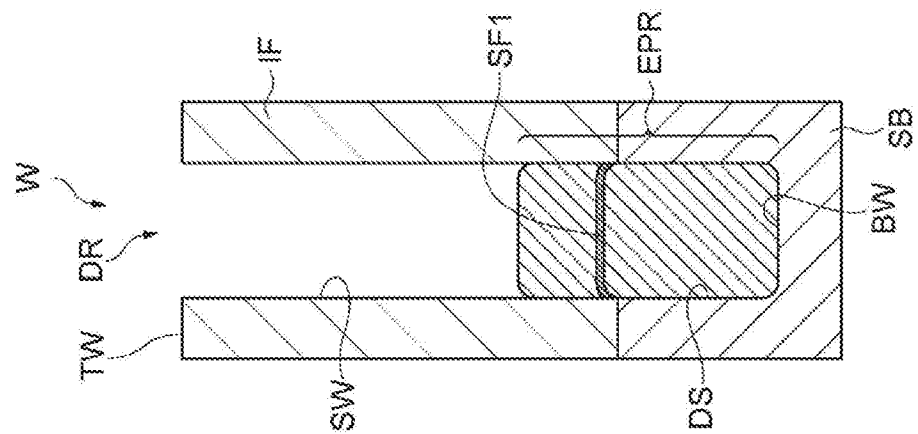
FIGS. 4A to 4C are sectional views illustrating states of a workpiece which has been subjected to respective steps of the method illustrated in FIG. 1.

At step ST6 illustrated in FIG. 1, which is subsequent to step ST5, an epitaxial region EPR is further formed from the semiconductor material of the second thin film TF2 as illustrated in FIG. 4A. At step ST6, by annealing the wafers W within the vessel 12, an epitaxial region is further formed from the semiconductor material of the second thin film TF2 moved toward the bottom of the depression DR. Specifically, at step ST6, migration is generated such that the semiconductor material of the second thin film TF2 is moved toward the bottom of the depression DR. Thus, an epitaxial region is further grown by solid phase epitaxial growth so that the moved semiconductor material has the same crystal structure as the crystal structure of the existing epitaxial region EPR. Thus, the epitaxial region EPR expands in the depression DR.

By the annealing performed at step ST6, the impurity contained in the doping layer SF1 is diffused into the epitaxial region EPR.

At step ST6, the wafers W are annealed within the vessel 12 set at a second pressure. Specifically, at step ST6, the internal temperature of the vessel 12 which accommodates the wafers W is set at a predetermined temperature. For example, the internal temperature of the vessel 12 is set at a temperature which falls within a range of about 300 degrees C. to 600 degrees C. At step ST6, the internal pressure of the vessel 12 is set at a second pressure. The second pressure may be, e.g., a pressure equal to or higher than $1.0 \times 10^{-10}$ Torr ($1.3 \times 10^{-8}$ Pa). The second pressure may be, e.g., a pressure equal to or lower than 1.0 Torr ($1.3 \times 10^2$ Pa). Furthermore, at step ST6, an inert gas such as a hydrogen gas or a nitrogen gas may be supplied into the vessel 12.

When step ST6 is implemented by using the processing apparatus 10, the control part 100 executes a control (a sixth control) which will be described below. In the sixth control, after the fifth control is executed, the control part 100 causes the heaters 30 to heat the internal space of the vessel 12. More specifically, in the sixth control, after the fifth control is executed, the control part 100 causes the exhaust device 42 to set the internal pressure of the vessel 12 at a second pressure and causes the heaters 30 to heat the internal space of the vessel 12. Specifically, in the sixth control, the control part 100 controls the exhaust device 42 so that the internal pressure of the vessel 12 is set at a second pressure, and controls the heaters 30 so that the internal temperature of the vessel 12 is set at a predetermined temperature. In the case of using an inert gas, the control part 100 controls the valve V41, the flow rate controller FC4 and the valve V42 so that an inert gas is supplied from the gas source GS4 into the vessel 12 at a predetermined flow rate.

Figure 4B:
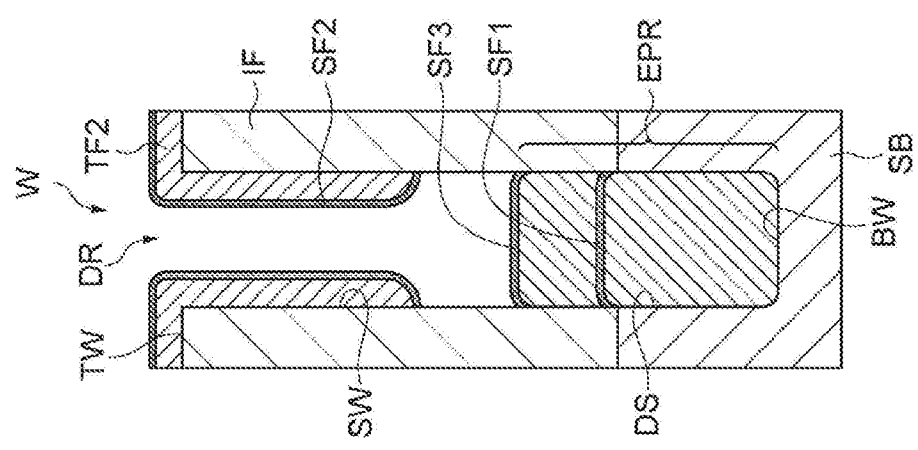

At step ST7 illustrated in FIG. 1, which is subsequent to step ST6, gas phase doping is performed with respect to the remaining portion of the second thin film TF2, which is left on the side wall surface SW without constituting the epitaxial region EPR, and the epitaxial region EPR. As illustrated in FIG. 4B, an impurity is doped on the surface of the remaining portion of the second thin film TF2 whereby a doping layer SF2 having a relatively high impurity concentration is formed so as to cover the surface of the remaining portion of the second thin film TF2. Furthermore, an impurity is doped on the surface of the epitaxial region EPR whereby a doping layer SF3 having a relatively high impurity concentration is formed so as to cover the surface of the epitaxial region EPR. By virtue of step ST7, the doping layer SF3 is formed on the surface of the epitaxial region EPR. The doping layer SF1 is included in the epitaxial region EPR.

At step ST7, in order to perform gas phase doping, the fourth gas is supplied into the vessel 12 which accommodates the wafers W. At step ST7, the flow rate of the impurity source gas (the fourth gas) may be set at, e.g., a flow rate which falls within a range of about 5 sccm to 5,000 sccm. At step ST7, the internal pressure of the vessel 12 may be set at, e.g., a pressure which falls within a range of about $1.0 \times 10^{-1}$ Torr (13 Pa) to 10 Torr ($1.3 \times 10^3$ Pa). The internal temperature of the vessel 12 may be set at, e.g., a temperature which falls within a range of about 30) degrees C. to 700 degrees C.

When step ST7 is implemented by using the processing apparatus 10, the control part 100 executes a control (a seventh control) which will be described below. In the seventh control, after the sixth control is executed, the control part 100 causes the gas supply part GF to supply the fourth gas into the vessel 12. Specifically, in the seventh control, after the sixth control is performed, the control part 100 controls the valve V21, the flow rate controller FC2 and the valve V22 so that the impurity source gas is supplied from the gas source GS2 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature.

Figure 4C:
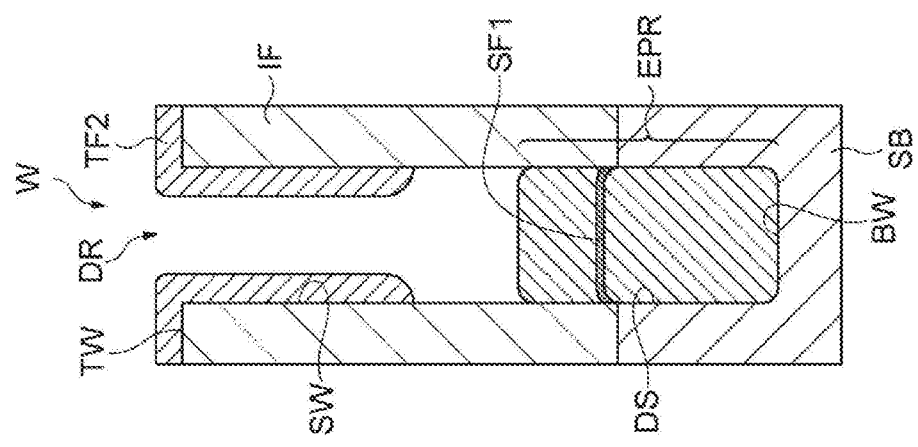

At step ST8 illustrated in FIG. 1, which is subsequent to step ST7, the second thin film TF2 left on the side wall surface SW without constituting the epitaxial region EPR is etched as illustrated in FIG. 4C. At step ST8, the fifth gas is supplied at a predetermined flow rate into the vessel 12 which accommodates the wafers W. The fifth gas is similar to the third gas used at step ST3. The fifth gas may contain one or more of $Cl_2$, HCl, $F_2$, $Br_2$ and HBr. The flow rate of the fifth gas may be, e.g., a flow rate which falls within a range of about 10 sccm to 5,000 sccm. At step ST8, the internal pressure of the vessel 12 is set at a predetermined pressure and the internal temperature of the vessel 12 is set at a predetermined temperature. The internal pressure of the vessel 12 at step ST8 may be, e.g., a pressure which falls within a range of about $1.0 \times 10^{-10}$ Torr ($1.3 \times 10^{-8}$ Pa) to $1.0 > 10^2$ Torr ($1.3 \times 10^4$ Pa). The internal temperature of the vessel 12 at step ST8 may be, e.g., a temperature which falls within a range of about 200 degrees C. to 700 degrees C.

The etching rate in etching the second thin film TF2 having the doping layer SF2 by the fifth gas is higher than the etching rate in etching the epitaxial region EPR having the doping layer SF1 and the doping layer SF3 by the fifth gas. Accordingly, as a result of step ST8, as illustrated in FIG. 4C, it is possible to selectively remove the second thin film TF2 while leaving the epitaxial region EPR (excluding the doping layer SF3). The doping layer SF3 is removed by implementing step ST8.

Furthermore, as a result of step ST6, the epitaxial region EPR includes the doping layer SF1 and therefore contains an impurity. The remaining portion of the second thin film TF2 exiting on the side wall surface SW does not substantially contain an impurity. The etching rate in etching the epitaxial region EPR containing an impurity by the fifth gas becomes higher than the etching rate in etching the epitaxial region EPR substantially not containing an impurity by the fifth gas. Thus, the etching rate in etching the epitaxial region EPR containing an impurity by the fifth gas becomes close to the etching rate in etching the second thin film TF2 by the fifth gas. Accordingly, if the second thin film TF2 is etched by the fifth gas after step ST6 without implementing step ST7, there is a possibility that the epitaxial region EPR containing an impurity is also etched by the fifth gas. However, in the method MT, step ST7 is implemented after step ST6. Thus, an impurity is added to the second thin film TF2 by gas phase doping before the second thin film TF2 is etched. The etching rate in etching the second thin film TF2 containing an impurity by the fifth gas is higher than the etching rate in etching the second thin film TF2 substantially not containing an impurity by the fifth gas. Accordingly, since the impurity is contained, the etching rate of the second thin film TF2 and the etching rate of the epitaxial region EPR are increased. Therefore, the difference in etching rate between the epitaxial region EPR and the second thin film TF2 is maintained at the time point at which step ST7 is implemented.

When step ST8 is implemented by using the processing apparatus 10, the control part 100 executes a control (an eighth control) which will be described below. In the eighth control, after the seventh control is executed, the control part 100 causes the gas supply part GF to supply the fifth gas into the vessel 12. Specifically, in the eighth control, after the seventh control is executed, the control part 100 controls the valve V51, the flow rate controller FC5 and the valve V52 so that the fifth gas is supplied from the gas source GS5 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature.

The remaining portion of the second thin film TF2 existing on the side wall surface SW may include a polycrystalline region due to the annealing performed at step ST6. Although the remaining portion of the second thin film TF2 includes the polycrystalline region, since the etching rate of the polycrystalline region is higher than that of the epitaxial region EPR, it is possible to selectively remove the remaining portion of the second thin film TF2 having the doping layer SF2 and including the polycrystalline region by the etching performed at step ST8.

At step STa illustrated in FIG. 1, which is subsequent to step ST8, determination is made as to whether a termination condition is satisfied. When the number of repetitions of the sequence SQ including steps ST4, ST5, ST6, ST7 and ST8, reaches a predetermined number, it is determined that the termination condition is satisfied. The predetermined number of times is one or more. If it is determined at step STa that the termination condition is not satisfied, the sequence SQ is implemented again. On the other hand, if it is determined at step STa that the termination condition is satisfied, the method MT is terminated.

According to the processing apparatus 10 described above, the control part 100 executes the second control of step ST2, thereby forming the epitaxial region EPR made of the semiconductor material of the first thin film TF1. After an impurity is added to the epitaxial region EPR by the gas phase doping performed in the fourth control of step ST4, an epitaxial region made of the semiconductor material of the second thin film TF2 is further formed on the epitaxial region EPR by the execution of the fifth control of step ST5 and the execution of the sixth control of step ST6. At the time point at which the sixth control of step ST6 is executed, the epitaxial region EPR contains the impurity added by the fourth control at step ST6. Therefore, the etching rate of the epitaxial region EPR is higher than that of the epitaxial region substantially not containing an impurity (the epitaxial region not subjected to the fourth control of step ST4). For that reason, if the control part 100 executes, subsequent to the execution of the sixth control of step ST6, the control for removing the second thin film TF2, which is left on the side wall surface SW without epitaxial growth, by etching, there is a possibility that the epitaxial region EPR containing an impurity is also affected by the etching. Prior to removing the remaining portion of the second thin film TF2 left on the side wall surface SW by the etching after the execution of the sixth control of step ST6, the control part 100 executes the seventh control of step ST7 so that an impurity is added by gas phase doping to the remaining portion of the second thin film TF2 left on the side wall surface SW, thereby forming the doping layer SF2. The etching rate of the second thin film TF2 containing the impurity (the doping layer SF2) is higher than that of a thin film made of a semiconductor material substantially not containing an impurity (a thin film not subjected to the seventh control of step ST7 executed by the control part 100). Since the impurity is added by the seventh control of step ST7 to the remaining portion of the second thin film TF2 left on the side wall surface SW, not only the etching rate of the epitaxial region EPR but also the etching rate of the second thin film TF2 left on the side wall surface SW is increased. Therefore, at the time point at which the control part 100 has executed the seventh control of step ST7, the difference of the etching rate between the epitaxial region EPR and the remaining portion of the second thin film TF2 left on the side wall surface SW is maintained. Accordingly, even if the control part 100 executes, subsequent to the execution of the seventh control, the control for removing the second thin film TF2 left on the side wall surface SW by etching, it is possible to sufficiently avoid the etching influence on the epitaxial region EPR (excluding the doping layer SF3). That is to say, it is possible to selectively remove the second thin film TF2 left on the side wall surface SW while leaving the epitaxial region EPR (excluding the doping layer SF3).

As described above, the processing apparatus 10 includes the exhaust device 42 which depressurizes the internal space of the vessel 12. The control part 100 can control the exhaust device 42. In the second control of step ST2, the control part 100 causes the exhaust device 42 to set the internal pressure of the vessel 12 at a first pressure and causes the heaters 30 to heat the internal space of the vessel 12. In the sixth control of step ST6, the control part 100 causes the exhaust device 42 to set the internal pressure of the vessel 12 at a second pressure and causes the heaters 30 to heat the internal space of the vessel 12. The first pressure and the second pressure may be, e.g., a pressure equal to or lower than $1.3 \times 10^2$ Pa. Since the first pressure used in the second control of step ST2 is, e.g., a pressure equal to or lower than $1.3 \times 10^2$ Pa, the migration attributable to the heating (annealing) performed in the second control of step ST2 can be caused in the semiconductor material of the first thin film TF1. Inasmuch as the second pressure used in the sixth control of step ST6 is, e.g., a pressure equal to or lower than $1.3 \times 10^2$ Pa, the migration attributable to the heating (annealing) performed in the sixth control of step ST6 can be caused in the semiconductor material of the second thin film TF2.

According to the method MT described above, after the impurity is added to the epitaxial region EPR by the gas phase doping at step ST4 and the doping layer SF1 is formed, an epitaxial region is further formed on the epitaxial region EPR (specifically, on the doping layer SF1) at steps ST5 and ST6. At the time point at which step ST6 has been implemented, the epitaxial region EPR contains the impurity (the doping layer SF1) added at step ST4. Therefore, the etching rate of the epitaxial region EPR is higher than that of the epitaxial region substantially not containing an impurity (the epitaxial region not subjected to step ST4). For that reason, if the step for removing remaining portion of the second thin film TF2 left on the side wall surface SW without epitaxially growing by etching is implemented subsequent to step ST6, there is a possibility that the epitaxial region EPR containing the impurity (the doping layer SF1) is also affected by the etching. According to the method MT, prior to removing the remaining portion of the second thin film TF2 left on the side wall surface SW after step ST6 by the etching, an impurity is added by gas phase doping at step ST7 to the remaining portion of the second thin film TF2 left on the side wall surface SW, thereby forming the doping layer SF2. The etching rate of the second thin film TF2 containing the impurity (the doping layer SF2) is higher than that of a thin film made of a semiconductor material substantially not containing an impurity (a thin film not subjected to step ST7). Since the impurity is added to the second thin film TF2 at step ST7, not only the etching rate of the epitaxial region EPR but also the etching rate of the second thin film TF2 is increased. Therefore, at the time point at which step ST7 has been implemented, the difference of the etching rate between the epitaxial region EPR and the second thin film TF2 is maintained. Accordingly, even if the step for removing the second thin film TF2 left on the side wall surface SW by etching is implemented subsequent to step ST7, it is possible to avoid the etching influence on the epitaxial region EPR (excluding the doping layer SF3). That is to say, it is possible to selectively remove the second thin film TF2 left on the side wall surface SW while leaving the epitaxial region EPR (excluding the doping layer SF3).

As described above, at step ST2, the wafers W can be annealed within the vessel 12 set at a first pressure. At step ST6, the wafers W can be annealed within the vessel 12 set at a second pressure. The first pressure and the second pressure may be, e.g., a pressure equal to or lower than $1.3 \times 10^2$ Pa. Since the first pressure and the second pressure are equal to or lower than $1.3 \times 10^2$ Pa, the migration caused by annealing can be generated in the semiconductor material of the first thin film TF1 and the semiconductor material of the second thin film TF2.

While the principle of the present disclosure has been shown and described above based on a preferred embodiment, it will be understood by those skilled in the art that the arrangement and details of the present disclosure may be changed without departing from the principle of the present invention. The present disclosure is not limited to the specific configurations disclosed in the present embodiment. Protection is sought for all the modifications and changes derived from the claims and the spirit thereof.

The depression filling method and the processing apparatus according to the present disclosure can be used to suppress the etching influence on an epitaxial region, for example, when a depression such as a hole or a trench formed on the surface of a semiconductor wafer is filled using an epitaxial region formed by solid phase epitaxial growth.

According to the present disclosure in some embodiments, it is possible to reduce the etching influence on an epitaxial region filled into a depression in the technique of filling a depression by the epitaxial growth of a semiconductor material.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling a depression of a workpiece which includes a semiconductor substrate and an insulating film formed on the semiconductor substrate, the depression passing through the insulating film and extending up to an inside portion of the semiconductor substrate, the method comprising:

forming a first thin film made of a semiconductor material substantially not containing an impurity along a wall surface which defines the depression;

by annealing the workpiece within a vessel, forming an epitaxial region conforming to crystals of the semiconductor substrate from the semiconductor material of the first thin film moved toward a bottom of the depression;

etching the first thin film remaining on the wall surface which defines the depression;

performing gas phase doping upon the epitaxial region;

forming a second thin film made of a semiconductor material substantially not containing an impurity along the wall surface which defines the depression;

by annealing the workpiece within the vessel, further forming an epitaxial region from the semiconductor material of the second thin film moved toward the bottom of the depression; and performing gas phase doping upon the second thin film remaining on the wall surface which defines the depression and the epitaxial region.

2. The method of claim 1, wherein the forming the epitaxial region includes annealing the workpiece within the vessel set at a first pressure, the further forming the epitaxial region includes annealing the workpiece within the vessel set at a second pressure, and the first pressure and the second pressure are equal to or lower than $1.3 \times 10^2$ Pa.

3. The method of claim 1, further comprising:

after performing the gas phase doping upon the second thin film and the epitaxial region, etching the second thin film remaining on the wall surface which defines the depression.

* * * * *